May 27, 1969 S. K. TALLY ET AL 3,446,908

PRINTED CIRCUIT TERMINATIONS AND METHODS OF MAKING THE SAME

Filed Nov. 1, 1966

INVENTORS
SIDNEY K. TALLY
THOMAS H. STEARNS
BY [signature]
ATTORNEY

United States Patent Office 3,446,908

Patented May 27, 1969

3,446,908

PRINTED CIRCUIT TERMINATIONS AND METHODS OF MAKING THE SAME

Sidney K. Tally, Nashua, and Thomas H. Stearns, Amherst, N.H., assignors to Sanders Associates, Inc., Nashua, N.H., a corporation of Delaware Filed Nov. 1, 1966, Ser. No. 591,305
Int. Cl. H05k *1/00, 3/00*
U.S Cl. 174—68.5 27 Claims

ABSTRACT OF THE DISCLOSURE

Terminations for printed circuit boards and methods of making same are herein disclosed and comprise various hollow tubes which are deformed by pressure or pressure and heat to cause bulges thereon to grip conductors of the printed circuit boards.

This invention relates to terminations for electrical circuits and more specifically to reliable terminations for printed circuitry utilizing bulged, hollow tubes with or without coatings of metals for promoting compression bonding or welding formed by pressure alone or a combination of heat and pressure.

Printed circuit boards as utilized in the prior art have taken many forms. Broadly speaking, these have been either of the flexible type wherein the printed circuit is produced on a relatively thin material having a flexible characteristic with or without an additional covering layer. The other type of printed circuitry utilizes a hard type of insulating material which is rigid and similarly made, having a protective covering applied in some instances, depending upon the application.

Printed circuits inherently consist of rather flimsy conductors which are thin in cross-section and, in many instances, of extremely narrow width. Adhesion of these relatively thin, narrow conductors to the base material, be it either rigid or flexible, is either through the use of adhesives or through the bonding technique as set forth in Patent No. 2,997,521, issued Aug. 22, 1961.

In view of the above, it is not expedient to make terminations to the relatively weak printed circuit conductors themselves, as in the case of conventional wire. If connections were to be soldered directly to the printed circuit conductors themselves, the heat involved in the soldering process will tend to destroy the bond between the conductor and its insulating base. On the other hand, assuming that connections could be made without destroying this bond, any subsequent stress in the connection will tend to separate the printed circuit conductor from the insulating base and, in some instances, even tear the conductor itself. Consequently, it becomes necessary to provide a mechanical as well as an electrical connection for any terminations made to inner circuit connections.

The use of eyelets, per se, to make terminations to printed circuit type boards and structures is known to the prior art. However, in carrying out the use of conventional eyelets in the printed circuit art, one of the difficulties has been that while a reliable mechanical connection is made to the circuit board itself, the electrical connection has been unreliable and incapable of withstanding the severe environmental conditions being imposed upon present day electronic equipment, especially for military applications. In using conventional eyelets or hollow rivets, the hole in both the plastic and copper conductor must be of a size such that the eyelet can be inserted. Consequently the chances of obtaining a good connection between the O.D. of the eyelets and their conductor by conventional upsetting of the eyelet head is very poor. If the eyelet is soldered in place by conventional means, the circuit may delaminate, which also makes it unreliable, especially under some environmental conditions.

Another problem in using the conventional riveting technique is in the multilayer type of circuit construction wherein several layers of printed circuits are combined both electrically and mechanically. In this instance, difficulties are obtained in assuring that each layer is properly connected electrically to the eyelet and has sufficient electrical and mechanical strength. One of the conventional approaches in multilayer circuitry known to the art is to apply each layer of printed circuit circuitry one at a time and solder each layer to the eyelet. This results in excessive heat being applied to the circuit layers, especially the first layers applied to the eyelet; in addition there is the inherent risk of delaminating the circuit layers, and the resulting terminations will be of doubtful reliability.

The invention here overcomes the aforementioned problems in that both a reliable mechanical and electrical connection is made to the circuit board through utilization of mechanical gripping of the circuit by the eyelet made in accordance with the invention.

In another embodiment of the invention, the mechanical and electrical connection is enhanced through the use of a metal and special heating technique which makes a thermal compression welded joint between the eyelet and the circuit conductors in addition to the mechanical connection. Another advantage is that reliable multilayer circuit arrangements are produced by the techniques taught by the invention.

It is therefore an object of this invention to provide an improved termination for circuit boards by the utilization of a joint which has been formed by mechanical formation of a connector resulting in a pressure weld.

Still another object of this invention is to provide an electrical connection between several circuit boards by utilizing a single eyelet tube to mutually interconnect circuit boards, each of the boards being mutually interconnected to the eyelet tube by the means of a bulge in the tube at the circuit board.

Another object of this invention is the establishment of a multilayer circuit board arrangement that employs a deformable or non-deformable spacer between the circuit boards to aid in the establishment of a mechanical welded joint at each circuit board.

Another object of this invention is to provide a highly durable eyelet by the utilization of selected metals which promote pressure welding between the eyelet and the conductor being interconnected.

Another object of this invention is to provide a high quality pressure welded conductor termination by the utilization of hydraulic fluid pressure within a tube that is an integral part of the termination, the pressure weld being brought about by the expansion of the tube due to hydraulic pressure, to grip a surrounding conductor.

Other objects of the invention will in part be obvious and will in part appear hereafter.

In carrying out the invention, the circuit board with its conductor or conductors has a hole drilled through the board. A tube is then inserted in the opening. This tube may be coated with gold or indium or other metal having similar plasticity and flowability to aid in the formation of a compression weld. The next step calls for the application of both heat and pressure to the tube, which results in a localized application of heat to the tube and conductor at the point of connection. This application of heat and pressure causes the tubing, which may be of copper, to soften along with the surface coatings of the tube, to bring about physical, mechanical and metallurgical union of the tube to the conductor of the circuit board by way of a physical bulging of the tube in the vicinity of the localized heat and pressure. The resulting joint between the tube and the conductor may be pure mechanical weld or, where there is a coating material, an actual metallurgical joint will be formed.

The invention accordingly comprises the features of construction, combination of elements, and arrangement of parts which will be exemplified in the method and construction hereinafter set forth, and the scope of this invention will be indicated in the claims.

For a fuller understanding of the nature and objects of the invention, reference should be had to the following detailed description, taken in connection with the accompanying drawings, in which.

Figure 3:
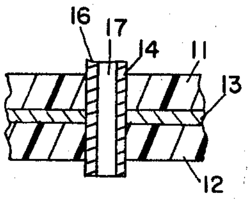
Figure 4A:
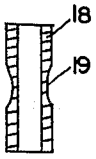
Figure 4B:
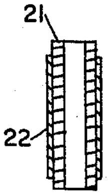
Figure 5:
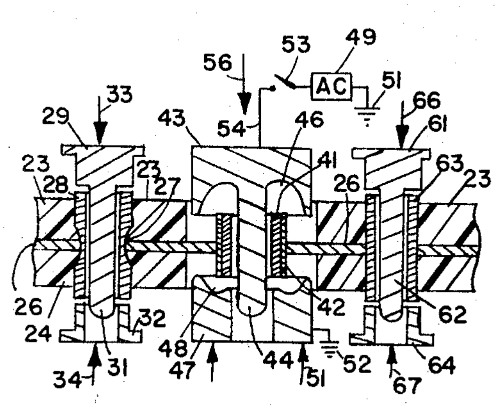
Figures 6, 6A:
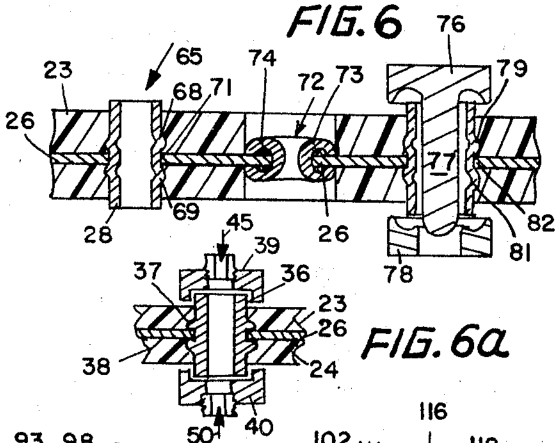
Figure 7:
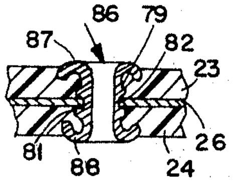
Figure 7A:
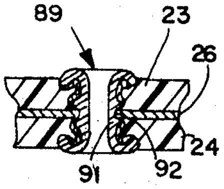
Figures 8, 9, 10:
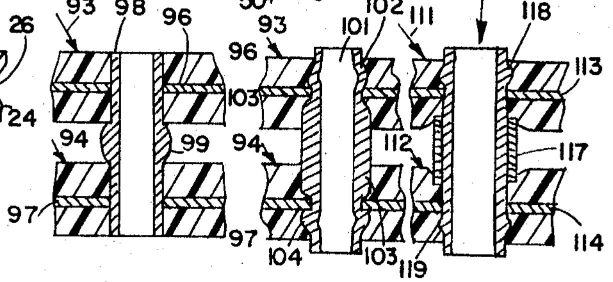
Figures 11, 12, 13:
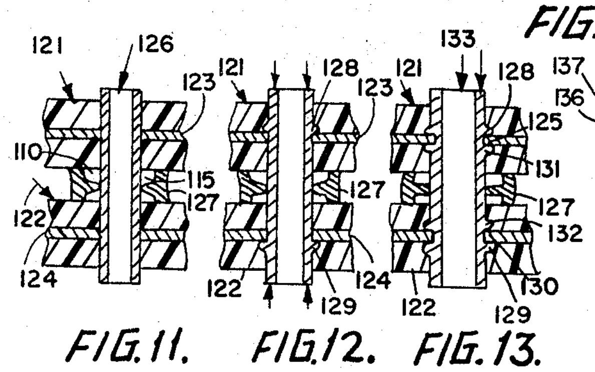

FIG. 3 is a sectioned portion of a typical circuit board with a metal tube inserted, FIGS. 4A and 4B depict two different tubular elements that may be utilized in the practice of the invention, FIG. 5 depicts several embodiments of the invention before the method of the invention has been fully performed, FIG. 6 depicts in part two finished eyelets made by the invention process and a third eyelet in the process of being finished, FIG. 6A illustrates a finished eyelet that has been formed by the joint action of physical pressure and a hydraulic pressure, FIG. 7 depicts a finished eyelet in section, FIG. 7A depicts a finished eyelet that utilizes a thermal compression weld, FIG.8 illustrates an initial method step to interconnect two circuit boards, FIG. 9 illustrates a finished eyelet interconnecting two circuit boards, FIG. 10 shows a finished eyelet which embodies one form of the invention, FIG. 11 depicts an initial step of interconnecting two circuit boards by another method which embodies the invention, FIG. 12 depicts an intermediate step of interconnecting two circuit boards by another approach which embodies the invention, FIG. 13 illustrates a finished eyelet interconnecting two circuit boards.

Figure 14:
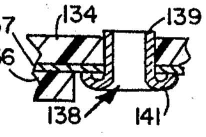
Figure 15:
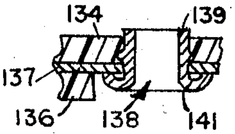

FIGURES 14 and 15 illustrate connecting a flanged eyelet to a single circuit board.

Figure 1:
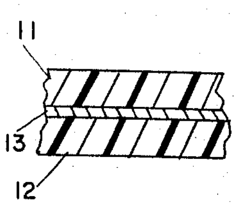
FIG. 1 is a sectioned portion of a typical circuit board.

With reference now to FIG. 1, we have illustrated a cross-section of a typical circuit board, which is made up of a layer of insulation 11 and a second layer of insulation 12, between which is located a sectioned electrical conductor 13. This circuit board may take the form of a rigid member where the layers of insulation 11 and 12 are of a plastic material whose yield strength is significantly lower than that of the electrical conductor material. There are many applications in which it is desirable to utilize flexible materials for these respective layers of insulation 11 and 12. In these instances, thermoplastic such as polyethylene, Teflon and Kel–F, to name a few, may be employed to add a flexible capacity to the circuit board. In this figure the conductor 13 is shown bonded between the layers of insulation material 11 and 12. The manner in which this conductor is bonded to the insulation layers is not pertinent to the invention to be described hereafter.

Figure 2:
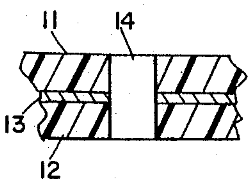
FIG. 2 is a sectioned portion of a typical circuit board at one step of the process.

Turning now to FIG. 2, there is illustrated the circuit board of FIG. 1 in which an opening 14 has been cut through the board. This opening may be formed by drilling or any suitable means.

FIG. 3 sets forth, as did FIGS. 1 and 2, the circuit board which will support the eyelet that is to be subsequently formed in the opening 14. FIG. 3 illustrates therefore a metal tube 16 of suitable material such as soft copper in the opening 14 of the circuit board, the tube 16 having a central tube opening 17 passing entirely through the tube.

With specific reference now to FIG. 4A and FIG. 4B, there are illustrated at least two distinctive tube shapes that may be employed in the manufacture of the eyelet to be described more fully hereafter. The metal tube of FIG. 4A 18 has shown at its central portion a preformed peripheral surface depression 19. The function of this depression and its coaction with the circuit board will be set out in greater detail hereafter. In FIG. 4B there is set forth a metal tube 21, which has, shown in a greatly enlarged schematic, a thin electroplated coating 22. The functions of this coating will be more fully made evident in a study which will follow with reference to FIG. 5. It is to be understood that the physical representations which follow have, in many cases, been greatly exaggerated, in that the clearances and the relative size of the parts are occasionally magnified to facilitate the explanation of the manner in which the eyelets are formed; but it is to be understood that most of the spacings shown are significantly smaller and the tolerances are held very close between mating parts in order to produce a high quality finished electrical connection.

FIG. 5 particularly sets forth a number of distinctly different embodiments of the invention, in that the initial method steps are incorporated in this FIG. 5 to provide three distinctive eyelets, each differing one from the other.

Starting now with the lefthand area of FIG. 5, we see illustrated a layer of insulation 23 and a second layer of insulation 24, between which a conductor 26 is shown sandwiched and in section. This circuit board is of the same type depicted in FIGS. 1 to FIG. 3. The board itself has had openings of the type ilustrated in FIG. 2 drilled or punched through the board, and in the illustration of the embodiment depicted to the left of FIG. 5, there has been inserted a metal tube 28 like the tube 18 (FIG. 4A) which has been compressed axially to bend the portion weakened by the groove 19 and form an internal reinforcing rib 27 at its central portion in the region where the tube 28 passes through the electrical conductor 26. This reinforcing rib 27 enhances a subsequent buckling of the tube. Mounted within the tube 28 is a male rammer head 29 with a male guide element 31 integrally affixed thereto, the male guide element 31 passing downwardly through the metal tube 28. In actual practice the fit of the male guide element is very close to the inside diameter of the tube 28. At the bottom of the tube 28 there is a female rammer element 32 which functions to receive the male guide element 31. The precise cooperation of the male rammer head 29 and the female rammer element 32 will be made more evident in a study of FIG. 6 to follow. Suffice it to say that there will be applied as shown by force arrows 33 and 34 forces to both ends of the metal tube 28, which action will result in the deformation of the tube in the manner depicted in FIG. 6. When even pressures are applied to both ends of the metal tube 28, tremendous forces tend to appear in the central region, where the tube 28 is restrained from lateral movement due to the presence of the rib 27 and the conductive element 26 which entirely surrounds the metal tube 28. This constraint brings to bear tremendous forces on opposite sides in the region where the conductor 26 and the rib 27 are in alignment. Since the tube cannot buckle inwardly to any significant degree because of the male guide element 31 and the rib 27, it must of necessity buckle and bulge in the manner depicted in FIG. 6.

With reference now specifically to FIG. 6, there is shown in the lefthand portion of this figure one form of a finished eyelet 65 which bears a direct relationship to the metal tube 28 shown in FIG. 5. In fact, the metal tube 28 of FIG. 5 has been deformed in the manner illustrated in FIG. 6, and there now appears present an upper gripping bulge 68, which bears down upon the conductor 26. Directly beneath the upper gripping bulge 68 is a lower gripping bulge 69, which coacts to pinch the conductor 26, and in so doing places pressures upon the joint 71 formed at the junction of the tube 28 and the conductor 26. In tests that have been applied to eyelets of this nature, it has been shown that the resistance to breakdown in usage is extraordinary, and, in fact, the joints so made are similar to a welded joint, in that the resistance of the joint to failure due to physical loading approaches that of an actual welded joint.

Referring now back to FIG. 5, the central portion thereof, we have illustrated a second technique contemplated by the invention. In this illustration we see a metal tube 41 that has been inserted through the conductor 26 immediately to the left in this figure. In addition, there is also illustrated a portion of the insulation material removed entirely from the region surrounding the joint at which the metal tube 41 passes through the conductor 26. This metal tube 41 has a metallic coating 42 on the surface thereof, much in the same manner that the metal tube 21 of FIG. 4B also has a metallic coating. This metallic coating may be a surface layer of gold or indium or other metal or alloy suitable for forming a thermal compression bond or weld. Further, since gold and indium form amalgams with copper by diffusion, surface treatments with either of these metals will result in a very high order of intimacy between the tube and conductor metals. Such a coating, being oxidation resistant and very soft and capable of plastic flow and diffusion promotes thermal compression welding to form a true metallurgical bond. Mounted within the metal tube 41 is a male guide element 44 which has at its upper region a male eyelet-forming head 43, the male eyelet-forming head 43 having thereon a curved lower surface 46 which functions when the male eyelet-forming head is moved downwards to form a finished eyelet 72 of the type illustrated in FIG. 6. Directly beneath the metal tube 41 there is a female eyelet-forming head 47. FIG. 5, which has, in a manner similar to the male eyelet-forming head, a curved surface 48, which functions to form the lower half of the finished eyelet illustrated in FIG. 6. This figure also contemplates the applications of short pulses of high current during the forming operation.

While it is not certain that an actual metal-to-metal weld is formed with only the use of physical pressure, certainly the long-term environmental stability of the joint will be enhanced by the use of some additional means. Great intimacy between the metal of the tube and the conductor could be achieved if there were employed, in the forming of the eyelet, electrical current and the presence of pressure. To accomplish these goals, as shown in FIG. 5, an alternating current source 49, which is shown schematically electrically connected to a ground 51, has its output control by a switch 53 which leads via an electrical connection 54 to the male eyelet-forming head 43. The abrupt heating of the joint can be facilitated by the use of very large pulses of current from a capacitor discharge welder, not shown in the drawings. The capacitor discharge welder would take the place of schematically illustrated AC source 49. Typical welders may also be pulse controlled AC or DC type welders.

Electrical connection to the female eyelet-forming head 47 occurs as the pressure is applied respectively to both heads of the eyelet-forming mechanism, as shown by pressure arrows 56 and 57. Since all of the parts involved are metal, resistive loading appears across the unit to the ground, designated ground 52. This resistive loading produces a tremendous localized source of heat, and this source of heat, coupled with the pressure of forming the eyelet, causes the softened copper to bulge in the region of the conductor and, with the coating of indium or gold, establishes a welded joint of a type depicted in the central region of FIG. 6.

Referring now to FIG. 6, in the central portion thereof, there is seen a finished eyelet 72, which has the solid tube 73 gripping the electrical conductor 26.

Referring now to FIG. 5 in which, to the right-hand side of the figure, there is illustrated a third embodiment of this invention which calls for the usage of a plain cylindrical tube 63 of the same type depicted in FIG. 3. Here a male rammer head 61 with its male guide element is shown positioned within the metal tube 63. Co-functioning with the tube and the male guide element 62 is a female rammer head element 64, which functions much in the same manner as the female rammer head 32 described earlier. Here pressure is applied as is designated by the pressure arrows 66 and 67, to bring a set of gripping bulges illustrated in FIG. 6.

Referring now to FIG. 6, it is evident that once the rammer elements 61 and 64 have been pressed together, there appear gripping bulges 79 and 81, which function to grip the electrical conductor 26 in a mechanical weld at 82. In order to further enhance the utility of this eyelet, the representation illustrated in FIG. 6 shows also a male eyelet-forming head 71 with its male guide element 77. This co-functions with the female eyelet-forming head 78 to produce the finished eyelet 86 illustrated in FIG. 7. This eyelet of FIG. 7 contains the gripping bulges 79 and 81 that were depicted in FIG. 6 and, in addition, contains the formed tube upper lip 87 and a formed tube lower lip 88 which grip the plastic insulation material 23 and 24 respectively.

While heretofore each of the tubular eyelet connections have been shown formed by the presence of pure physical pressure in conjunction in some instances with heat, the invention contemplates that the gripping bulges set forth in FIG. 6 be created by still another method. FIG. 6A sets forth another method which utilizes hydraulic fluid pressure. In this figure the layer of insulation 23 and layer of insulation 24 are illustrated on either side of the conductor 26, just as in the earlier figures. In a gripping relationship to the conductor 26 is a formed finished tube 36 with gripping bulges 37, 38. These bulges 37 and 38 have been formed by the combined action of an upper hydraulic pressure head 39 and a lower hydraulic pressure head 40, which have been simultaneously brought towards each other to place pressure on the tube 36. While not shown, there is a hydraulic pressure source which is mutually fed to both openings 45 and 50. Since the pressure within the tube 36 must be equal on all areas, there is a greater degree of restraint where the conductor 26 comes in contact with the tube 36 to thereby establish a region in which the tube 36 will not give in the presence of the hydraulic pressure. Since there is no significant restraint on either side of the conductor 26 there will be formed the gripping bulges 37 and 38. While not illustrated in this figure, it is contemplated that this finished tubular connection could also employ the use of a thin metallic covering, such as gold, indium or other metal for promoting thermal compression bonding on the tube's outer surface along with a simultaneous application of heat to further enhance the electrical and mechanical properties of the finished conductor termination.

As can be seen in FIG. 7, the finished eyelet 86 with its formed tube upper lip 87 and its formed tube lower lip 88, relies exclusively for its physical and electrical connection on the upper gripping bulge 79 and the lower gripping bulge 81. As has been pointed out, when maximum electrical and mechanical contact is desired, the outer surface of the tube may be covered with a thin metallic coating of suitable metal for promoting thermal compression bonding, and there may then be applied a source of heat to the eyelet as it is being formed to produce a joint which relies both on a mechanical connection and a metallurgical connection to join the eyelet to the electrical conductor 26. This is illustrated in FIG. 7A. While the method steps necessary to produce this eyelet have not been illustrated specifically, it is believed that it is evident that a joint of the type depicted in the righthand section of FIG. 6 may have had its outer surfaces treated with a metallic coating such as gold or indium, and the production of a finished eyelet such as that depicted in FIG. 7A as finished eyelet 89 would result if there is an application of both heat and pressure to the joint. This figure discloses the metallic coating 91 in double-hatch, as well as a mechanical joint 92. This joint, therefore, has been further enhanced in its electrical and mechanical physical properties by the inclusion of the metallic coating on the outer surface of the tube to be formed into an eyelet.

While not shown in the drawings, it is wholly within the purview of this invention to include a metallic tube such as a nickel tube as the male forming guide element which would remain within the eyelet after it is formed. Since this tube could be longer than the distance through the eyelet, it would provide a practical physical extension of the eyelet for subsequent connection to additional circuit components or even to a subsequent layer of circuit boards.

This invention embraces several ways to interconnect two or more printed circuit boards where the insulation layers are formed of plastic material which has yield strength significantly lower than the strength of the conductor metals. The remaining figures in this application concern themselves with typical embodiments of interconnections made between circuit boards. The first such interconnection is depicted in FIG. 8, wherein a circuit-carrying board 93 as well as a circuit-carrying board 94 have been physically joined by a metal tube 98. This metal tube having at its central region a pre-bulged section 99, which pre-bulged section will function to cooperate with the circuit conductors 96 and 97 when an application of pressure is made to both ends of the tube 98 to form the tube in the manner depicted in FIG. 9.

In FIG. 9 there is illustrated, absent the forming tools as illustrated in FIG. 5, a finished eyelet 101 interconnecting the two circuit boards 94 and 93. The electrical and mechanical interconnection between the conductors 96 and 97 being furnished by the upper gripper bulge 102 in cooperation with the central gripping bulge 103, which central gripping bulge 103 is slightly enlarged due to the compressive action brought about in the formation of the finished eyelet. The conductor 97 is gripped mechanically and electrically by the lower gripping bulge 104 in conjunction with the central gripping bulge 103. It should be recognized that while this circuit interconnection is shown absent a thin metallic coating, it is within the contemplation of this invention that such a metallic coating be added with the utilization of pressure and a source of heat if the circumstances require a further enhancement of the eyelet's electrical properties.

There are additional ways in which multi-layer circuit boards can be interconnected. One such way is to include between the circuit boards to be interconnected a non-deformable spacer. Just such an approach is illustrated in FIG. 10, where a circuit-carrying board 111 with its conductor 113 is shown integrally interconnected to a second circuit board 112 with its conductor 114. Located intermediate the circuit boards is a non-deformable spacer 117 which acts to co-function upon the application of pressure with the tube to form an upper gripping bulge 118 as well as a lower gripping bulge 119, the finished eyelet 116 representing another approach to the formation of a mechanical and electrical interconnection between the circuit boards 111 and 112.

Further technique for producing an interconnection between two circuit boards is illustrated in FIGS. 11 through 13. In FIG. 11 a circuit board 121 and a circuit board 122 have passing therethrough a tube 126 which will in a subsequent step be formed into a finished eyelet, to electrically connect conductors 123 and 124. Interposed between the boards 121 and 122 is a deformable spacer 127 which has regions 115 and 110, within which the spacer may deform to receive a part of the plastic insulation material and/or a portion of the tube, should deformation of the tube be of a magnitude which would cause the bulge to expand into these regions 110 and 115. The production of the finished eyelet is basically a two-step operation after the deformable spacer has been located between the circuit boards. FIG. 12 illustrates the first step, in which there has been formed by the application of pressure an upper gripping bulge 128 and a lower gripping bulge 129 to grip the circuits 123 and 124 respectively. The final step to produce a finished eyelet is set forth in FIG. 13, wherein the spacer 127 is shown deformed as a result of the continuing application of pressure to the eyelet. Upon this continuing application of pressure to the eyelet, inner gripping bulges 131 and 132 are thereby provided to mechanically weld joints 125 and 130, which result in the final finished eyelet 133 being established. It should also be understood that wherever eyelets are to be formed, the addition of a metallic coating for promoting the formation of a thermal compression weld by the application of heat and pressure to enhance the electrical and mechanical properties of the eyelet, if desired, is contemplated by this invention.

Another technique for producing a finished eyelet is set forth in FIGS. 14 and 15. In FIG. 14 a single circuit board has been shown, comprised of insulation layers 134 and 136, between which is bonded a conductor 137, much in the manner depicted in the earlier figures. However, in this instance, insulation layer 136 has been removed at the end portion of the circuit board or strip. Disposed centrally in FIG. 14 is a preformed tubular eyelet, that is to say, the eyelet has a preformed conductor-gripping lip 141 which is firmly in contact with the conductor 137. This figure does not include an illustration of the mechanical forming heads needed to form this finished eyelet. Suffice it to say they are similar to the earlier described forming devices. A tubular portion 139 of the preformed tubular eyelet 138 is exposed as illustrated in order that a subsequent forming step may be applied to the eyelet to produce the finished eyelet shown in FIG. 15.

In this FIG. 15 there is shown formed in the tubular portion 139 a peripheral gripping bulge 142 which has been established by the presence of a compressive pressure upon the eyelet to produce the bulge. This figure does not illustrate a metallic coating on the tubular eyelet portion 139, but any suitable metal may be coated on the tubular eyelet so that the subsequent application of heat and pressure will produce a thermal compression bond with conductor 137.

While there have been hereinbefore described what are at present preferred embodiments of the invention, it will be apparent that many and various changes and modifications may be made to the embodiments illustrated without departing from the spirit of the invention. It will be understood, therefore, that all such changes and modifications as fall fairly within the scope of the present invention as defined in the appended claims are to be considered as a part of the present invention.

We claim:

1. The method of making a termination in an insulated circuit board having a conductor mounted integrally with said insulated circuit board comprising the steps of:

(A) establishing an opening through said insulated circuit board and said conductor, (B) inserting a closely fitting metal tube of deformable material in said opening, (C) welding said metal tube to said conductor by simultaneously placing pressure uniformly over both ends of said tube to thereby place in compression said metal tube, which results in said tube deforming on either side of said conductor to bind in said conductor opening and provide an electrical and mechanical connection between said metal tube and said conductor.

2. The method set forth in claim 1 wherein said metal tube has on its outer surface a thin metallic coating.

3. The method set forth in claim 2 wherein said metal-coated tube has a source of heat applied to said metal tube during said simultaneously applied uniform pressure to thereby cause said metalic coating to flow and further enhance said electrical and mechanical connection between said tube and said conductor.

4. The method set forth in claim 1 wherein said metal tube has a source of fluid under pressure connected to both ends of said tube to further enhance the deformation of said tube and bind in said conductor opening.

5. The method set forth in claim 1 wherein said tube has one end thereof preformed to aid in gripping said conductor upon insertion of said tube in said opening.

6. The method set forth in claim 5 wherein said metal tube has on its outer surface a thin metallic coating.

7. The method set forth in claim 6 wherein said metal-covered tube has a source of heat applied to said metal tube during said simultaneously applied uniform pressure to thereby cause said metallic coating to flow and further enhance said electrical and mechanical connection between said tube and said conductor.

8. The method of making terminations in a first and second insulated circuit board, each board having at least one conductor mounted integrally with said board, said circuit boards having a spacer therebetween, comprising the steps of:

(A) establishing an opening through said first and second insulated circuit boards and each of said conductors, (B) inserting a single closely fitting metal tube of deformable material through said opening in said first board and through said spacer and thence through said second board to thereby physically interconnect said insulated circuit boards.

(C) welding said metal tube to said conductor by simultaneously applying a presure uniformly over both ends of said tube to thereby place in compression said metal tube which results in said tube deforming at said opening to grip said conductor of said first circuit board, said metal tube and said conductor of said second circuit board.

9. The method set forth in claim 8 wherein said spacer is of a physical strength sufficient to resist deformation during the simultaneous application of pressure to both ends of said tube.

10. The method set forth in claim 8 wherein said spacer is made of a deformable material which permits said tube to deform on either side of each conductor to pinch said conductor and provide electrical connection between said tube and each of said conductors.

11. The method set forth in claim 8 wherein said metal tube has on its outer surface a thin metallic coating.

12. The method set forth in claim 11 wherein said metal-coated tube has a source of heat applied to said metal tube during said simultaneously applied uniform pressure to thereby cause said metallic coating to flow and further enhance said electrical connection between said tube and each of said conductors.

13. The method of making terminations in a first and second insulated circuit board, each board having at least one conductor mounted integrally with said board, comprising the steps of:

(A) establishing an opening through said first and second insulated circuit boards and each of said conductors, (B) inserting a single closely fitting metal tube which has a radially enlarged central region such that said first and second boards thereby located said radially enlarged portion between said boards, while said tube functions to physically interconnect said insulated circuit boards, (C) welding said metal tube to said conductor by simultaneously applying a pressure uniformly to both ends of said tube to thereby place in compression said metal tube which results in said tube deforming to bind said opening to said conductor and provide an electrical connection between said conductor of said first circuit board, said metal tube and said conductor of said second circuit board.

14. An eyelet conductor termination for a circuit board comprised of:

(A) a conductor mounted upon a circuit board, (B) said conductor having a tubular eyelet termination passing through said conductor, said tubular eyelet having a pair of peripherally disposed bulges that grip said conductor of said circuit board forming a compression welded joint between said bulges and said conductor.

15. The eyelet conductor termination of claim 14 wherein said tubular eyelet has a thin metal coating on the outer surface of said tube to thereby enhance both mechanical and electrical connection of said tubular eyelet to said conductor.

16. The eyelet conductor termination of claim 15 wherein said metal coating on said outer surface is a selected metal that will easily form an amalgam with said conductor and said tubular eyelet.

17. An eyelet conductor termination for a plurality of circuit boards comprised of each board including first and second layers of insulation and having a conductor mounted therebetween, said conductor having a tubular eyelet termination passing through said conductor to mutually interconnect the conductor on each circuit board, a spacer surrounding said tubular eyelet and interposed between said circuit boards, said tubular eyelet having at least one peripherally disposed bulge that coacts with each conductor to grip said conductors on each circuit board forming a mechanically welded joint between each of said bulges and said conductors.

18. The eyelet conductor termination of claim 17 wherein said spacer is of a non-deformable material.

19. The eyelet conductor termination of claim 17 wherein said spacer is of a deformable material, further including a pair of peripherally disposed bulges at each of said conductors, said bulges functioning to grip said conductors of said circuit board forming a mechanical welded joint between said bulges and said conductor.

20. The eyelet conductor termination of claim 17 wherein said tubular eyelet has a thin metal coating on the outer surface of said tube, to thereby enhance both mechanical and electrical connection of said tubular eyelet to each conductor of each circuit board.

21. The eyelet conductor termination of claim 20 wherein said metal coating on said outer surface is a selected metal that will readily form an amalgam with each of said conductors and said tubular eyelet.

22. The method of making a termination in an insulated circuit board having a conductor interposed between between two layers of insulation, comprising the steps of:

(A) establishing an opening through said two layers of insulation and said conductor, (B) inserting a closely fitting metal tube of deformable material in said opening, (C) welding said metal tube to said conductor by simultaneously placing pressure uniformly over both ends of said tube to thereby place in compression said metal tube, which results in said tube deforming on either side of said conductor and displacing a portion of said two layers of insulation to thereby cause said tube to bind at said conductor and provide an electrical and mechanical connection between said metal tube and said conductor.

23. The method set forth in claim 22 wherein said metal tube has on its outer surface a thin metallic coating.

24. The method set forth in claim 23 wherein said metal tube has a source of heat, applied to said metal tube during said simultaneously applied uniform pressure to thereby cause said metallic coating to flow and further enhance said electrical and mechanical connection between said tube and said conductor.

25. An eyelet conductor termination for a circuit board comprised of:

(A) a conductor mounted between two layers of insulation, (B) said conductor having a tubular eyelet termination passing through said conductor, said tubular eyelet having a pair of peripherally disposed bulges that grip said conductor and displace a portion of said layers of insulation forming a compression welded joint between said bulges and said conductor.

26. The eyelet conductor termination of claim 25 wherein said tubular eyelet has a thin metal coating on the outer surface of said tube to thereby enhance both mechanical and electrical connection of said tubular eyelet to said conductor.

27. The eyelet conductor termination of claim 26 wherein said metal coating on said outer surface is a selected metal that will easily form an amalgam with said conductor and said tubular eyelet.

References Cited

UNITED STATES PATENTS

| | | | |
|---|---|---|---|
| 2,535,403 | 12/1950 | Frogatt. | |
| 2,734,150 | 2/1956 | Bech | 174—68.5 |
| 2,892,129 | 6/1959 | Henry. | |
| 3,281,923 | 11/1966 | Best et al. | 29—628 |

FOREIGN PATENTS

| | | |
|---|---|---|
| 678,537 | 1/1964 | Canada. |
| 977,021 | 12/1964 | Great Britain. |

DARRELL L. CLAY, *Primary Examiner.*

U.S. Cl. X.R.

29—470.1, 522, 624, 628; 219—150.5; 317—101; 339—17